United States Patent
Shimura et al.

(10) Patent No.: US 7,404,130 B2
(45) Date of Patent: Jul. 22, 2008

(54) METHOD FOR OPTIMIZING A PATTERN GENERATION PROGRAM, A PROGRAM, AND A SIGNAL GENERATOR

(75) Inventors: Masaru Shimura, Tokyo (JP); Takuya Otani, Tokyo (JP); Masaharu Goto, Saitama (JP)

(73) Assignee: Agilent Technologies, Inc., Santa Clara, CA (US)

( * ) Notice: Subject to any disclaimer, the term of this patent is extended or adjusted under 35 U.S.C. 154(b) by 496 days.

(21) Appl. No.: 11/181,955

(22) Filed: Jul. 14, 2005

(65) Prior Publication Data

US 2006/0041809 A1 Feb. 23, 2006

(30) Foreign Application Priority Data

Aug. 18, 2004 (JP) ............................. 2004-237882

(51) Int. Cl.
 *G01R 31/28* (2006.01)
 *G06F 9/44* (2006.01)

(52) U.S. Cl. ...................................... 714/738; 717/106

(58) Field of Classification Search ................. 714/738; 717/106

See application file for complete search history.

(56) References Cited

U.S. PATENT DOCUMENTS

| 6,014,764 | A | 1/2000 | Graeve et al. ............... 714/738 |
| 6,784,686 | B2* | 8/2004 | Nishida et al. .............. 324/765 |
| 7,315,970 | B2* | 1/2008 | Arakawa et al. ............ 714/718 |

FOREIGN PATENT DOCUMENTS

| JP | 10-160808 | 6/1998 |
| JP | 11-064469 | 3/1999 |
| JP | 2000-162287 | 6/2000 |

* cited by examiner

*Primary Examiner*—Shelly A Chase
(74) *Attorney, Agent, or Firm*—Marc Bobys

(57) ABSTRACT

A method for optimizing a pattern generation program used in a signal generator comprising a generator for generating a signal pattern based on a pattern generation program, a memory for storing the signal pattern, and an output for outputting on a predetermined cycle the signal pattern stored by the memory, this optimizing method comprising an evaluation step for evaluating for each command of the pattern generation program whether it is necessary to develop the command in question of the program and a development step for developing the command.

8 Claims, 8 Drawing Sheets

```
Step 30:         DATA 0
Step 31:         LOOP 3
Step 32:         JSR SUB1
Step 33:         JSR SUB2
Step 34:         LOOP END
Step 35:         STOP
Step 36: SUB1    DATA 1
Step 37:         RTN
Step 38: SUB2    DATA 2
Step: 39:        RTN
```

(a)

```
DATA0:           0000
DATA1:           1010
DATA2:           1111
```

| | |
|---|---|
| Clock1: Step 30: | DATA 0 |
| Clock 2: Step 31: | LOOP 3 |
| Clock 3: Step 32: | JSR SUB1 |
| Clock 4: Step 36: SUB1 | DATA 1 |
| Clock 5: Step 37: | RTN |
| Clock 6: Step 33: | JSR SUB2 |
| Clock 7: Step 38: SUB2 | DATA2 |
| Clock 8: Step 39: | RTN |
| Clock 9: Step 34: | LOOP END |
| Clock 10: Step 32: | JSR SUB1 |
| Clock 11: Step 36: SUB1 | DATA 1 |
| Clock 12: Step 37: | RTN |
| Clock 13: Step 33: | JSR SUB2 |
| Clock 14: Step 38: SUB2 | DATA 2 |
| Clock 15: Step 39: | RTN |
| Clock 16: Step 34: | LOOP END |
| Clock 17: Step 32: | JSR SUB 1 |
| Clock 18: Step 36: SUB 1 | DATA 1 |
| Clock 19: Step 37: | RTN |
| Clock 20: Step 33: | JSR SUB 2 |
| Clock 21: Step 38: SUB2 | DATA 2 |
| Clock 22: Step 39: | RTN |
| Clock 23: Step 34: | LOOP END |
| Clock 24: Step 35: | STOP |

*Fig. 4   Prior Art*

| | |
|---|---|
| Step 50: | DATA 0 |
| Step 51: | DATA 1 |
| Step 52: | DATA 2 |
| Step 53: | DATA 1 |
| Step 54: | DATA 2 |
| Step 55: | DATA 1 |
| Step 56: | DATA 2 |
| Step:57: | STOP |

*Fig. 5   Prior Art*

| | |
|---|---|
| Step 70: | DATA 0 |
| Step 71: | LOOP 3 |
| Step 72: | DATA 1 |
| Step 73: | DATA 2 |
| Step 74: | LOOP END |
| Step 75: | STOP |

*Fig. 10*

| | |
|---|---|
| Step 80: | LOOP 7 |
| Step 81: | DATA 1 |
| Step 82: | LOOP END |

(a)

| | |
|---|---|
| Step 91: | DATA 1 |
| Step 92: | LOOP 2 |
| Step 93: | DATA 1 |
| Step 94: | DATA 1 |
| Step 95: | DATA 1 |
| Step 96: | LOOP END |

METHOD FOR OPTIMIZING A PATTERN GENERATION PROGRAM, A PROGRAM, AND A SIGNAL GENERATOR

FIELD OF THE INVENTION

The present invention relates to the optimization of a pattern generation program of a digital pattern signal generator, and in particular, to a method for optimizing a pattern generation program of a signal generator comprising a first-in, first-out memory (FIFO memory), a program, and a signal generator.

DISCUSSION OF THE BACKGROUND ART

It is often the case with semiconductors, circuit boards, and other digital circuitry having digital signal processing functions that digital signals of a predetermined pattern are input from the outside and the operation of the circuit is controlled or output signals are detected and function tests are conducted. By means of this type of control and testing, a plurality of signal pattern types are often needed for the signals that are input from the outside, and it becomes necessary to flexibly change the signal pattern in accordance with changes in control conditions or testing conditions. Therefore, attention is being focused on systems with which a signal pattern is generated by executing a program in which the signal pattern to be generated is entered by a processor as a signal generator for generating digital signal patterns.

A typical conventional signal generator is shown in FIG. 2. A signal generator 26 consists of a memory 20, a processor 23 connected to memory 20, and a signal output circuit 24 to which the output of processor 23 is connected. A pattern generation program 21 in which the signal pattern is entered and pattern data 22 that serve as the basic signal pattern are stored in memory 20. An example of pattern generating program 21 and pattern data 22 is shown in FIGS. 3(a) and (b), respectively. Processor 23 executes pattern generation program 21 in synchronization with clock signals and generates a signal pattern. Signal output circuit 24 converts the signal pattern generated by processor 23 to electrical signals on the signal level of a device 25, which is the object under control or test, and outputs these signals to device 25.

Next, the operation of signal generator 26 in FIG. 2 will be described taking as an example operation during execution of the pattern generating program in FIG. 3. FIG. 4 is a drawing representing the execution commands for each clock signal, and the clock by which the signal pattern is output to device 25 is underlined. It should be noted that the DATA command in the program in FIG. 3(a) is the command to generate pattern data represented by the argument taken from pattern data 22. The LOOP command is the command for repeated execution of commands, from the LOOP command to the LOOP END command, by the number of arguments. The JSR command is the command to execute the subroutine of the argument. The STOP command is the command to stop the program.

When the pattern generation program is being executed, the DATA command of step 30 is executed at the first clock (clock 1) to generate signal pattern "0000" that is stored by processor 23 as DATA0 of pattern data 22. Next, the next clock (clock 2) is set such that the LOOP command of step 31 is executed and the step from the LOOP command (step 31) to LOOP END command (step 34) is repeated three times. The JSR command of step 32 is executed at clock 3 and subroutine SUB1 (steps 36 and 37) is called. The DATA command of step 36 is executed at clock 4 by calling this subroutine to generate signal pattern "1010" stored as DATA1 of pattern data 22. The RTN command of step 37 is executed at clock 5 and the system returns from the subroutine to the main routine.

The same operation is performed for subroutine SUB2 from clocks 6 through 8 to generate signal pattern "1111" that is stored as DATA2 of pattern data 22. An evaluation of loop frequency and loop processing are conducted by the LOOP END command at clock 9. Steps 31 through 34 have only been executed once at this point; therefore, [the system] returns to step 32 and executes the details of the second repetition. The second loop is performed at clocks 10 through 16 and when a third repetition has been completed at clocks 17 through 23, the pattern generation program is ended by the STOP command at clock 24.

As is clear from FIG. 4, the time of 24 clocks is necessary to execute the pattern generation program in FIG. 3(a). During this time, a signal pattern is generated at underlined clocks 1, 4, 7, 11, 14, 18, and 21. Therefore, when the timing by which each signal pattern is generated is taken into consideration, the time interval from when the signal pattern of clock 1 is generated to when the signal pattern of clock 4 is generated is three clocks, while the time interval from when the signal pattern of clock 7 is generated to when the signal pattern of clock 11 is generated is four clocks. Thus, there is a problem in that when the pattern generation program in FIG. 3 is executed by signal generator 26 in FIG. 2, the pattern generation intervals are not consistent.

The method whereby the pattern generation interval is held constant by entering pattern generation program 21 by the DATA command only as shown in FIG. 5 is a potential method for solving this problem. By means of this method, it is not necessary to process the other commands in between the DATA commands; therefore, signal patterns can be output at the same time interval as the DATA command processing time (one clock). However, there is a problem in that pattern generation program 21 becomes longer in proportion to the length of the signal patterns; therefore, the pattern generation program becomes extremely long and a large memory 20 becomes necessary when the same signal pattern is repeated several times.

Moreover, there is a technology such as that described in Patent Reference 1 whereby the signal pattern generation cycle is held constant by an appropriate placement in the program of the no-operation command (NOP command) for a predetermined time. However, the time needed for execution of the command varies with the type of pattern generation program 21 compiler or processor 23; therefore, a pattern generation program 21 that corresponds to the properties of signal generator 26 must be created for each device. In addition, programming must be performed while referring to the signal generation timing and high-performance programming technology therefore becomes necessary. Furthermore, there is a problem with this method in that residual signal pattern generation timing is combined with timing having the longest signal generation time interval, and the maximum frequency of the signal pattern therefore becomes from ⅓ to 1/30 of the clock signal frequency.

Therefore, there is a method wherein a FIFO memory 62 is used at the output, as with a signal generator 60 in FIG. 6. The signal generator 60 and the signal generator 26 in FIG. 2 differ in that FIFO memory 62 is disposed between the output of processor 61 and the signal output circuit 24 of signal generator 60 and this signal generator has the function of stopping the operation of processor 61 when FIFO memory 62 is full. However, the operation of the other structural elements is the same.

Prior to outputting signal patterns to device 25, signal generator 60 generates signal patterns and then outputs signal patterns in succession once a predetermined number of signal patterns have been stored in FIFO memory 62. When the output speed from FIFO memory 62 is faster than the signal generation speed of processor 61, signals are generated without restopping processor 61. However, if the DATA command continues and FIFO memory 62 becomes full, processor 61 is stopped until FIFO memory 62 again has free capacity.

Thus, by means of signal generator 60 in FIG. 6, signal patterns generated by processor 61 are stored in FIFO memory 62 and are then output from FIFO memory 62 to device 25 at predetermined cycles; therefore, it is not necessary to take the signal generation timing into consideration when creating the pattern generation program 21. Moreover, the signal output starts after a signal pattern has been pre-stored in FIFO memory 62; therefore, it is possible to output signal patterns at a faster frequency than with signal generator 26 in FIG. 2.

However, the capacity of FIFO memory 62 is finite; therefore, when pattern generation program 21 with a complex structure is executed, long FIFO memory 62 becomes empty during the execution of the signal pattern generation program and the signal patterns cannot be output at a predetermined cycle (default). If a FIFO memory 62, which large enough to prevent default, is loaded, the device will inevitably become larger, more complex, and more expensive. Therefore, it is necessary to optimize pattern generation program 21 in accordance with the FIFO memory 62 capacity and the ratio of the speed of pattern generation and pattern output, and with other system properties.

SUMMARY OF THE INVENTION

A method for optimizing a pattern generation program used in a signal generator comprising a generator for generating a signal pattern based on a pattern generation program, a memory for storing the signal pattern, and an output for outputting on a predetermined cycle the signal pattern stored by the memory, this optimizing method comprising an evaluation step for evaluating, for each command of the pattern generation program, the necessity of developing the command in question of the program and a development step for developing the command.

That is, changes in the number of patterns stored in FIFO memory 62 as a command in question is executed are investigated for each command of the program prior to executing pattern generation program 21 and only those commands that pose the possibility of a default are simplified. It is not possible to determine whether or not there is a default of the optimized structure of the loop or subroutine commands themselves and it therefore is necessary to evaluate these commands by investigating the loop details or the details of the subroutine that has been called up.

The present invention makes it is possible to prevent the pattern generation program from becoming very long and to eliminate any default.

BRIEF DESCRIPTION OF THE DRAWINGS

FIG. 3 is an example of the pattern generation program and pattern data:

FIG. 4 is a drawing showing the operation of a conventional signal generator in clock order.

FIG. 5 is another conventional pattern generation program.

FIG. 10 is another version of the pattern generation program developed by the optimizing method of the present invention.

FIG. 11 is a drawing of the method for evaluating whether development is necessary and developing the LOOP routine.

DETAILED DESCRIPTION OF THE PREFERRED EMBODIMENT

Figure 1:
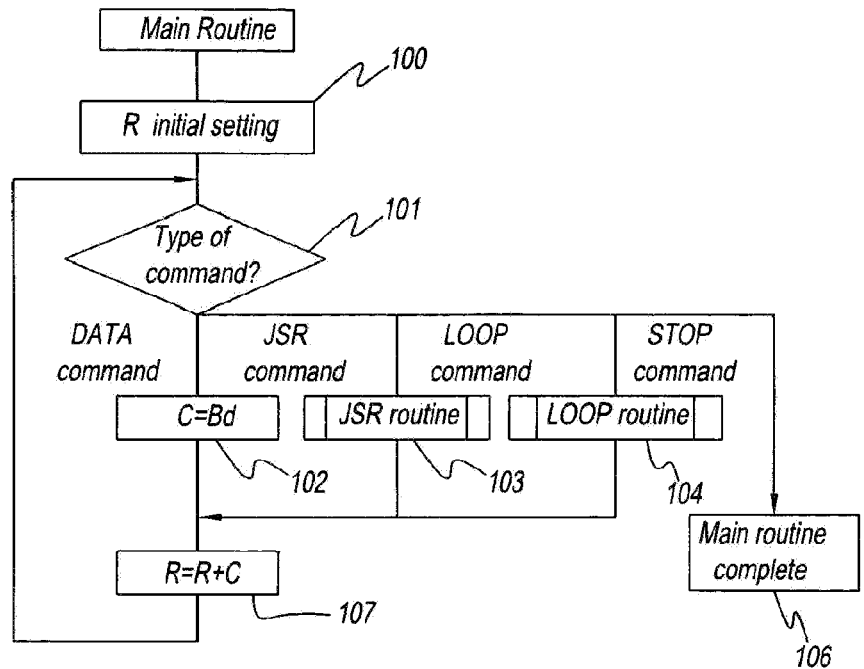
FIG. 1 is a flow chart of the main routine of the optimizing method of the present invention.

A preferred embodiment of the signal generator of the present invention will be described in detail while referring to the drawings.

Figure 2:
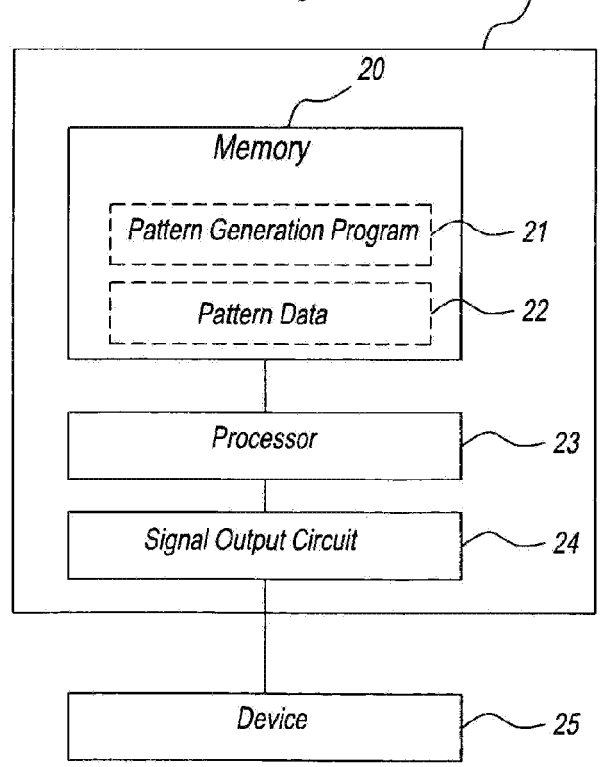
FIG. 2 is a drawing of a conventional signal generator.
Figure 6:
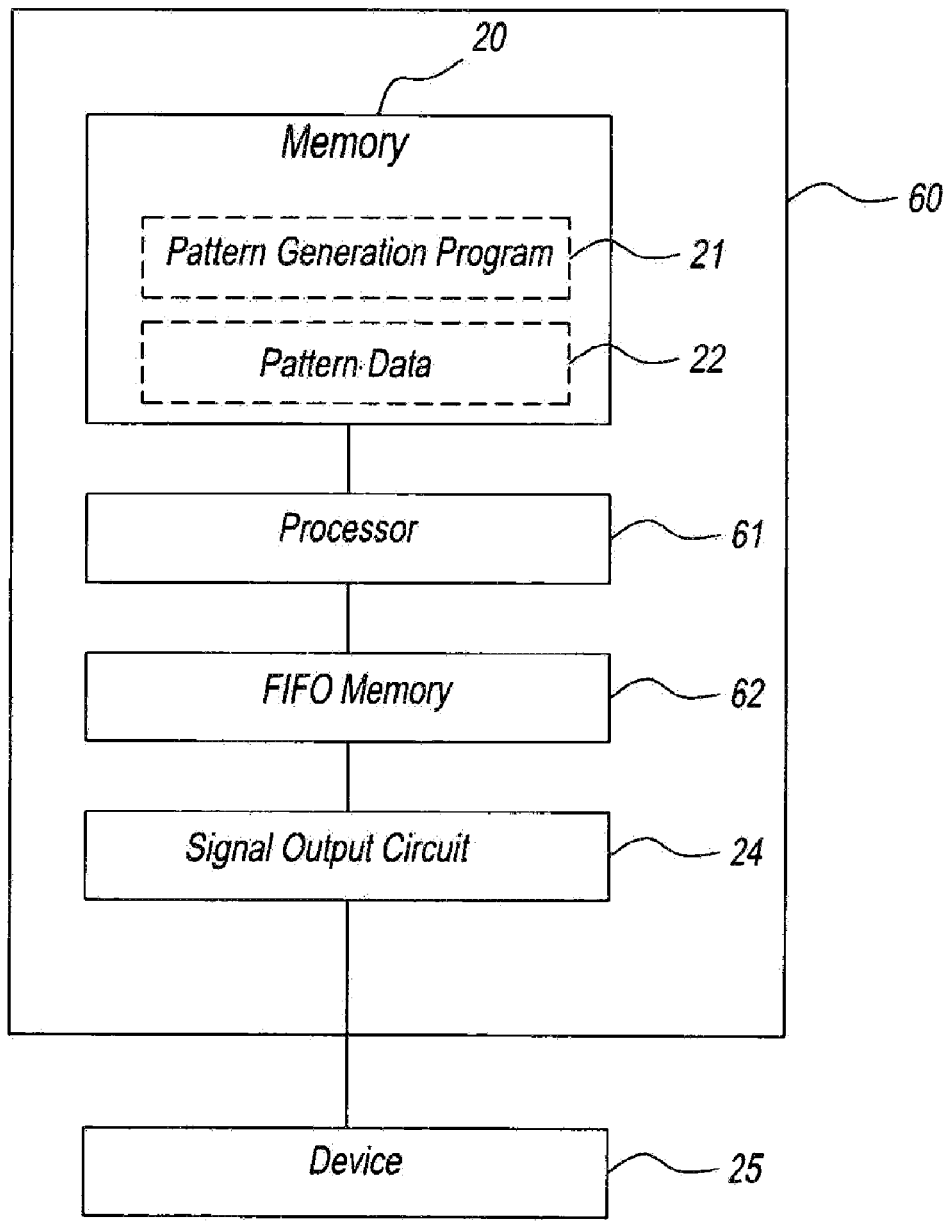
FIG. 6 is a drawing of a conventional signal generator.
Figure 7:
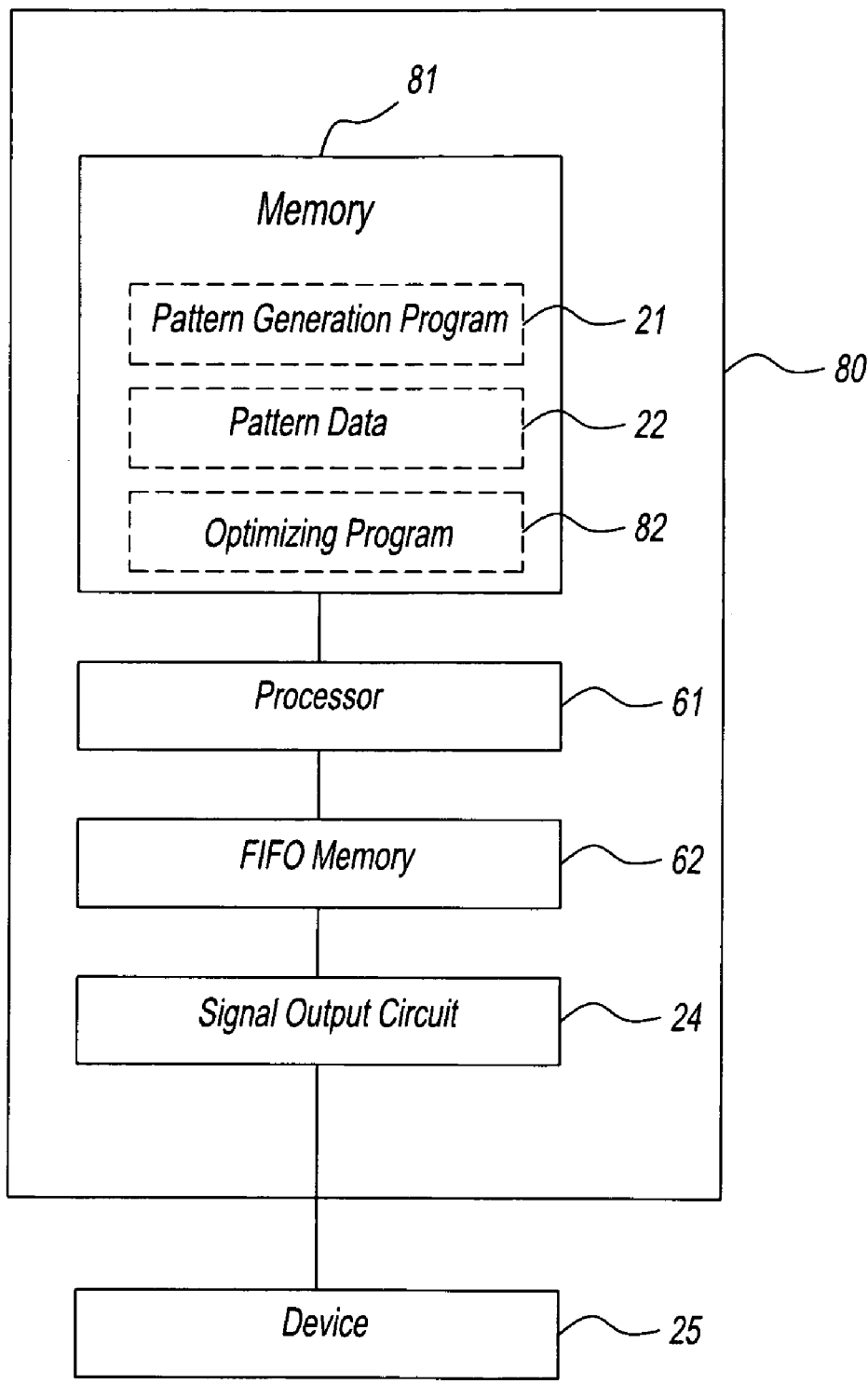
FIG. 7 is a drawing of the signal generator of the present invention.

FIG. 7 is a structural drawing of a signal generator 80 that uses the present invention. The same numbers are used for the structural elements in FIG. 7 that have the same or similar functions as those in FIGS. 2 and 6.

Signal generator 80 comprises a memory 81 (second memory), a processor 61 (generator) connected to memory 81, a FIFO memory 62 (first memory) connected to the output of processor 61, and a signal output circuit 24 (output) connected to the output of FIFO memory 62. The output of signal generator 80 is connected to the signal pattern input of device 25.

Pattern generation program 21 in which signal patterns are entered, pattern data 22 of the basic signal patterns, and optimizing program 82 for optimizing pattern generation program 21 by the method of the present invention are stored in memory 81. Examples of pattern generation program 21 and pattern data 22 are shown in FIGS. 3(*a*) and (*b*), respectively.

Processor 61 executes pattern generation program 21 and an optimizing program 82 in accordance with clock signals. Processor 61 used by the present working example has the function of processing any command in one clock. As with signal generator 60 in FIG. 6, processor 61 of signal generator 80 of the present invention has the function of stopping operation until the capacity of FIFO memory 62, which becomes full, is again available.

Input signals from processor 61 are stored in FIFO memory 62 in synchronization with clock signals and in accordance with the writing requests from processor 61. Moreover, signal output circuit 24 outputs in succession the stored signal patterns in synchronization with the reading clock. In this embodiment, the clock signal frequency of the signal output circuit 24 is generated by means of frequency dividing of the clock signal of processor 61 by 2 (half frequency) and the clock signals that are obtained are used as the reading clock. It should be noted that the reading clock can be created by dividing the frequency of the clock signals of processor 61 and using these signals without further processing, or signals that are asynchronous with processor 61 or the clock signals can be used.

Next, the operation of signal generator 80 in FIG. 7 will be described. First, processor 61 executes optimizing program 82 and optimizes pattern generation program 21 such that a default is not generated during the execution of pattern generation program 21. Next, pattern generation program 21 that has been optimized by processor 61 is executed and a signal pattern is generated. The generated signal patterns are stored in succession in FIFO memory 62. Signal output circuit 24 begins signal output to device 25 once a predetermined number of signal patterns have been stored in FIFO memory 62. When the DATA command continues and FIFO memory 62 becomes full, operation of processor 61 is stopped until free capacity becomes available in FIFO memory 62. As a result, it is possible to obtain signal patterns under a constant cycle by the reading clock of FIFO memory 62, regardless of the signal pattern generating timing of processor 61.

In the following description, the subroutine call command (JSR command) itself is called the subroutine header, the return command (RTN command) is called the subroutine tail, and the details of subroutines other than the return command are called the subroutine body. Moreover, the loop command (LOOP command) itself is called the loop header, the loop end command (LOOP END command) is called the loop tail, and the loop details between the LOOP command and the LOOP END command are called the loop body. The pattern generation command (DATA command) itself is called the DATA command body.

The amount of change in the number of signal patterns stored in FIFO memory 62 is represented as Hj, B, and Tj during subroutine header, body, and tail processing, respectively. The amount of change in the number of signal patterns stored in FIFO memory 62 is the theoretical value obtained by subtracting the number of signal patterns output from signal output circuit 24 from the number of signal patterns stored in FIFO memory 62 during execution of the command in question. By means of signal generator 80 of this embodiment, any command is executed within one clock period, and signals from the signal pattern are output from signal output circuit 24 every two clocks. Therefore, the amount of change in the number of signal patterns is an increase of 0.5 with the DATA command and a reduction of 0.5 by commands other than the DATA command. Consequently, Hj and Tj have constant values of −0.5, and B is a variable that changes with the details of the subroutine.

Similarly, the amount of change in the number of signal patterns stored in FIFO memory 62 are represented by H1, B, and T1 at the loop header, body, and tail, respectively. By means of this embodiment, H1=T1=constant value of −0.5, and B is a variable that changes with the loop details. Furthermore, the body of the DATA command is represented as Bd. Bd is a single command and therefore a constant value (+0.5). The above-mentioned procedure is summarized in Table 1.

TABLE 1

| Amount of change in number of steps stored | Header | Body | Tail |
| --- | --- | --- | --- |
| Subroutine command | JSR Hj (constant value) | Subroutine details B | RTN Tj (constant value) |
| Loop command | LOOP H1 (constant value) | Loop details B | LOOP END T1 (constant value) |
| DATA command | | DATA Bd (constant value) | |

Figure 8:
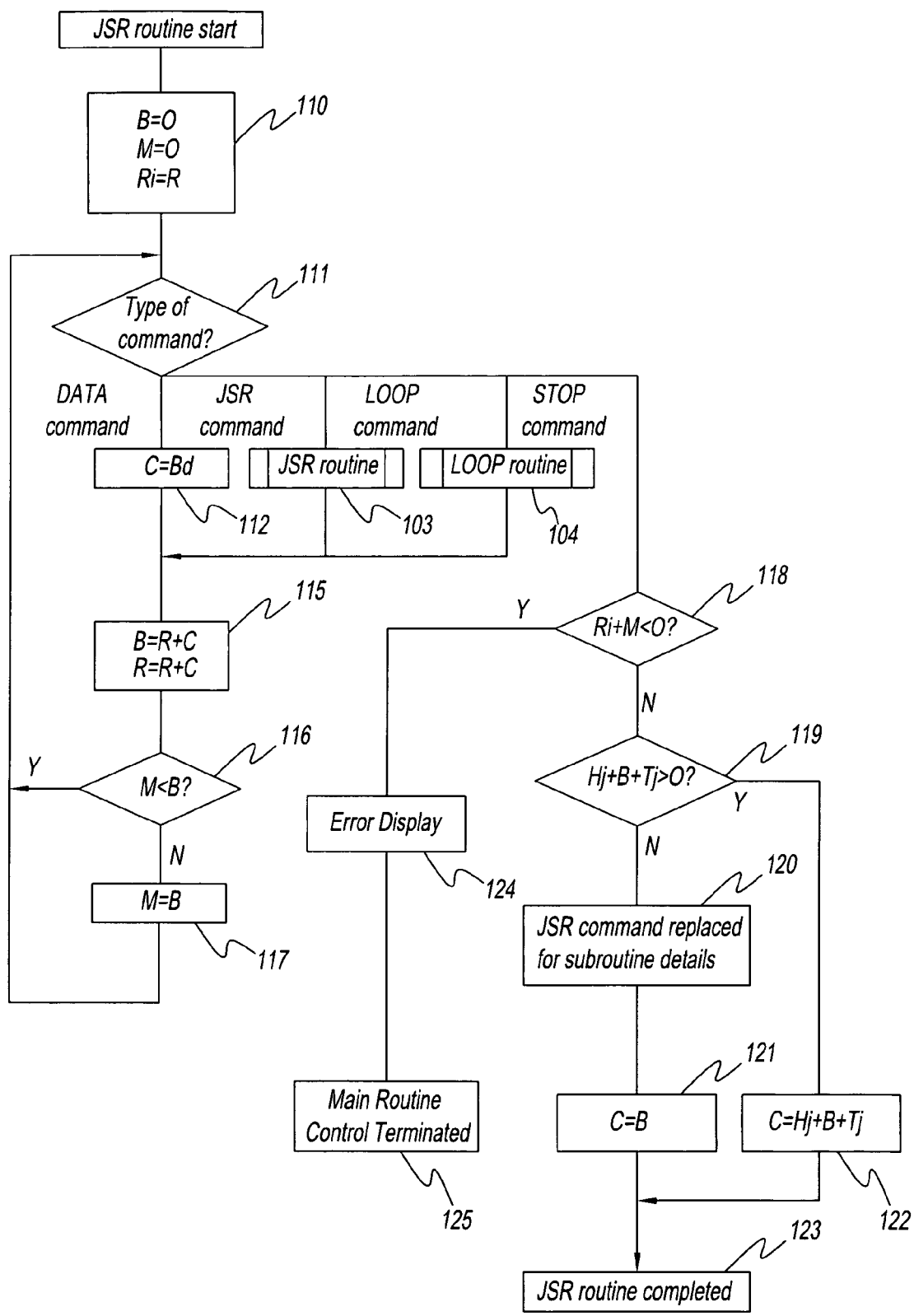
FIG. 8 is the flow chart of the JSR routine for the optimizing method of the present invention.
Figure 9:
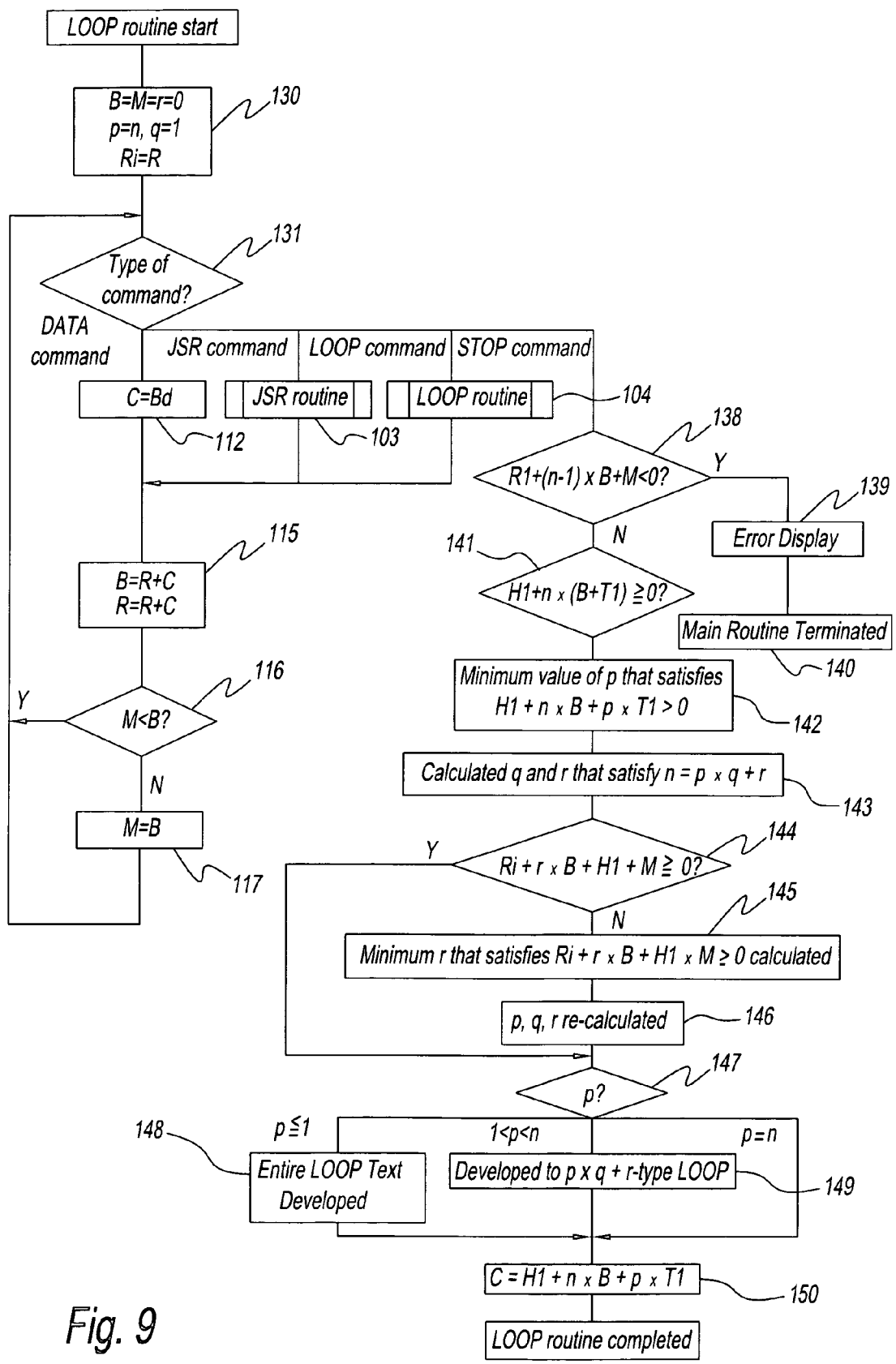
FIG. 9 is a flow chart of the LOOP routine of the optimizing method of the present invention.

Next, taking the optimization of pattern generation program 21 in FIG. 3(a) as an example, the method for optimization by optimization program 82 will be described while referring to the flow chart in FIGS. 1, 8, and 9. FIG. 1 is a flow chart of the main routine of optimizing program 82. FIG. 8 is the flow chart of a JSR routine 103 for evaluating the necessity of developing subroutine call commands (JSR commands) and developing the command when necessary. FIG. 9 is the flow chart of a LOOP routine 104 for evaluating the necessity of the loop command (LOOP command) and developing the command as necessary.

The step number in the program as shown in FIGS. 3, 4, and similar figures, is shown together with the step number in the flow chart in parenthesis, such as (flow chart 100) in order to avoid confusing the step number in flow charts such as FIGS. 1, 6, and similar figures.

Of the variables in the flow chart, R is the number of signal patterns stored in FIFO memory 62. Usually R is initially set at 0 because FIFO memory 62 is empty when the pattern generation program 21 is being executed, but R≠0 when several pattern generation programs are executed continuously or when a program is executed after a predetermined number of signal patterns have been stored in FIFO memory 62. By means of this embodiment, optimization is performed by executing pattern generation program 21 after two signal patterns have been stored in FIFO memory 62; therefore, the initial value of R is 2.

Ri and C are the dummy variables of R and B, respectively. Moreover, M is the minimum number of signal patterns stored in FIFO memory 62 during execution of the body (during the first execution in the case of the loop command) when the starting point of each processing routine serves as the reference point for optimization. Variables B and M are local variables; therefore, variables are not exchanged between routines, and when a different routine is called up during the execution of a routine, the current values are stacked in the memory and the stacked value in question is read and substituted when the system returns to the main routine.

Optimizing program 82 initially sets R at 2 (flow chart 100). Then it evaluates the initial command type (flow chart 101). The initial command is the DATA command of step 30. Therefore, C=Bd (=0.5) is substituted (flow chart 102) and added to R (flow chart 107). As a result, R=2.5.

The next command is the LOOP command of step 31. Therefore, a LOOP routine 104 is executed. First the variable is initially set with the LOOP routine (flow chart 130). Then the details of the loop are analyzed in order to find the amount of change in the R value by execution of the loop (steps 31 through 34) and the M value when the first loop is executed (minimum B value). First, the command type of step 32 is determined (flow chart 131). Step 32 is a JSR command and JSR routine 103 is therefore called. The R value changes by H1 (=−0.5) as a result of the LOOP command execution in step 31; therefore, the initial value of R when the JSR routine is processed is 2.

First, the variable is initially set with the JSR routine (flow chart 110). Then the minimum number M of signal patterns stored in FIFO memory 62 is found when the subroutine is running. First, the initial command type is identified from the subroutine details (flow chart 111). Step 36 is a DATA command and C=Bd (=0.5) is therefore substituted (flow chart 112) and added to B and R (flow chart 115). B=0.5 and is larger than M=0; therefore, the system moves to analysis of the next command. When step 36 is processed to reduce the number of signal patterns stored in FIFO memory 62, M≧B (flow chart 116) and the value of B is substituted for M (flow chart 117). As a result, the minimum B is stored at M when the subroutine is being executed.

We return now to the description of the operation of the program in FIG. 3. Step 37 is the RTN command indicating completion of the subroutine. Thus, the amount of change in the R value with processing of the subroutine details is stored at value B and the minimum B is stored at value M at this point. Therefore, the values obtained by adding M to the number of stored signal patterns Ri when the JSR routine is started is first evaluated (flow chart 118). If this value is less than 0, the default state cannot be erased, even if the subroutine is developed (the subroutine command is replaced by the subroutine details). Consequently, in this case, an error is displayed (flow chart 124) and the execution of the optimizing program is stopped (flow chart 125).

In the case of this embodiment, Ri+M=2; therefore, optimization is possible. In order to evaluate the necessity of developing the command, the amount of changes in the number of stored signal patterns of the entire subroutine (including calling up and return processing) (Hj+B+Tj) is evaluated (flow chart 119). When Hj+B+Tj is greater than 0, the number of stored signal patterns increases as a result of subroutine execution and therefore development is not necessary. In this case, the amount of change in the number of signal patterns stored when the subroutine is being executed (Hj+B+Tj) is substituted at C (flow chart 122) and the JSR routine is completed (flow chart 123).

In the case of this embodiment, Hj+B+Tj=−0.5<0. Therefore, the JSR command of step 32 is replaced for the subroutine details of step 36 (flow chart 120). There is no subroutine calling up or return processing with development of the subroutine; therefore, the amount of changes in the number of stored signal patterns becomes the amount of change B during execution of the subroutine details (=0.5). This value is substituted for C (flow chart 121), the JSR routine is stopped, and the system returns to the LOOP routine (flow chart 123). Of the loop processing in steps 31 through 34, optimization of step 32 is completed.

First, the C value is added to the B and R values in the LOOP routine to which the system has returned (flow chart 135). C=0.5; therefore, B=0.5 and R=2.5. Then the M and B values are compared (flow chart 136). When M≧B, B is substituted at M (flow chart 137), but M is 0 at this time and therefore, M<B and B is not substituted for M.

Step 33 is the JSR command; therefore, the JSR routine is executed as in step 32. As a result, step 33 is developed as in step 32. As a result of this optimization, the B value after step 33 becomes 1 and the R value becomes 3 (flow chart 135). Step 34 is the LOOP END command indicating the completion of the loop command. Therefore, the amount of change in the R value with processing per loop is stored at the B value and the minimum B value is stored at M. Therefore, the system first evaluates whether or not the total of the R value when the LOOP routine starts (Ri; number of signal patterns stored when the LOOP routine starts), the value obtained by multiplying the value of B times the result obtained when 1 is subtracted from the number of loops (n) (amount of change in the number of signal patterns stored from the time the loop command is started to when the final loop is started), and M (minimum B when the final loop is executed) is less than 0 (flow chart 138). If this value is less than 0, the default cannot be erased, even if the entire loop command has been developed (the loop details are entered in succession by the number of loops). Consequently, an error is displayed (flow chart 139) and the optimization program is stopped (flow chart 140).

In the case of this embodiment, Ri+(n−1)×B+M=2.5+2× 1+0 ≧0; therefore, optimization is possible. Consequently, the system evaluates whether the total of the amount of change in the number of signal patterns stored of the LOOP command itself (H1) and the value obtained by multiplying the number of loops (n) times the amount of change in the number of patterns stored with one loop processing (B+T1) is 0 or greater (flow chart 141; first condition for evaluating whether development is necessary). If this total is less than 0, there will be a reduction in the stored number of signal patterns as the loop is executed; therefore, the development will proceed (the loop details are entered and the number of times the command is executed once the loop is completed is reduced). The increment change in the number of patterns stored by the processing of the LOOP END command changes before and after development. Therefore, the maximum number of LOOP. END commands that must be processed so that there will be no default is found (flow chart 142). That is, when the LOOP END command is executed p times, the number of patterns stored changes by n×B+H1+p× T1; therefore, the maximum p is found as n×B+H1+p×T1≧0. In specific terms, −(n×B+H1)/T1 is found and the value obtained by rounding this value off serves as p.

Next, the number of loops q from the loop details during the loop (after the loop command) and the number of loops r from the loop details before the loop (before the loop command) are found such that the number of times the loop end command is executed is p. That is, the value obtained by dividing n by p is q and the remainder is r. For instance, when seven loops (n=7) as in FIG. 11(a) are developed such that the loop end command is executed twice (p=2), it is possible to enter the loop details three times (q=3) during the loop and to enter the loop details once before the loop (r=1), as in FIG. 11(b).

In the case of this embodiment, H1+n×(B+T1)=−0.5+3× (1−0.5)=1≧0; therefore, the processing in flow charts 142 and 143 is not conducted. Next, the system evaluates whether the total for the stored number of signal patterns before loop processing Ri, the value obtained by multiplying r by the amount of change B in the number of patterns stored by the execution of the loop details, the amount of change H1 in the number of patterns stored for the LOOP command itself, and the minimum for the number of patterns M stored during execution of the loop details is 0 or greater (flow chart 144, second condition for evaluating the necessity of development). If this total is less than 0, there will be a default during the first loop processing, even if there is an increase in the number of patterns stored with the entire loop processing. Therefore, the loop details are also disposed before the loop command so that a sufficient number of patterns is stored before loop processing is started. Consequently, the minimum r such that the total is 0 or greater is calculated (flow chart 145). More specifically, the value of r where r≧−(Ri+ H1+M)/B should be found; therefore, the value of −(Ri+H1+ M)/B is found, and when this value is an integer, it serves as r, but when it has decimals, r becomes the value that is obtained by rounding this figure off by adding 1 to the integer.

Next, p, q, and r are recalculated from the remaining number of loops (n−r) (flow chart 146). After recalculation in this case, r is set such that it is larger than the r found at flow chart 145.

Moreover, the loop end command is set such that it is no larger than the p found at flow chart 142 (not restricted when flow chart 142 is not executed). That is, when n−r<p, p=n−r and the value obtained by dividing n−r by p serves as q and the remainder is added to r.

In the case of this embodiment, Ri+r×B+H1+M=2.5+3×1− 0.5+0>0. Therefore, the processing in flow charts 145 and 146 is not performed. The development is based on the results obtained under the first and second conditions for evaluating whether development is necessary. First, the p value is evaluated (flow chart 147). When p≦1, the entire loop processing is developed. Moreover, as results from FIG. 11, when 1<p<n, the loop details are disposed r times before the LOOP command, the loop details are disposed q times after the LOOP command, and the number of loops is set at p. As with this embodiment, when p=n, that is, when the number of loops after development is the same as the number of loops before development, development is not necessary and is not performed.

Finally, the amount of change in the signal patterns stored with loop processing after development (H1+n×B+p×T1) is substituted for C (flow chart 150). Optimization of loop processing is continued until steps 31 through 34 are completed and the system returns to the main routine. The next command (step 35) is the STOP command that indicates the end of pattern generation program 21; therefore, execution of the optimization program stops (flow chart 106). The pattern generation program 21 after development is shown in FIG. 10. By means of the optimizing method of the present invention, pattern generating program 21 can be optimized such that it is kept from becoming too long and a default is avoided.

By means of this embodiment, the variables to be evaluated were compared with 0 when evaluating whether development was necessary (flow charts 119, 141, and 144), but the variables can be compared to 1 or a larger number. There is an increase in resistance to default with an increase in the number that is compared, and it is possible to control default generation and to output stable signal patterns, even if the processing capability of processor 61 is temporarily reduced for some reason during the operation of pattern generation program 21. However, the program after optimization becomes longer with an increase in the number used for comparison, and it is therefore preferred that a number no larger than what is necessary is used.

By means of this embodiment, the means for generating the signal pattern and the means for optimizing the pattern generation program employed the same processor 61; therefore, pattern generation program 21 and optimization program 82 were executed by the same processor 61. However, these programs can be executed by different processors. The advantage of using the same processor as in the this embodiment is that the device structure is simplified and its cost is inexpensive. On the other hand, when a processor capable of high-speed memory processing is used for the optimization means and a processor that specializes in DSP or other signal processing is used for the signal generator, there is an advantage in that high-speed optimization and signal pattern generation become possible.

Processor 61 that is used in this embodiment has the function of processing any command in the program by one clock, but a processor that does not have this function can also be used. In such a case, the amount of change is found from the signal pattern cycle that is output from signal output circuit 24 and the processing time of each command when the amount of change in the stored number of signal patterns in FIFO memory 62 (for instance, Hj, T, Bd, etc.) is calculated. For instance, one signal pattern is output from signal output circuit 24 when one signal pattern is generated by a DATA command if the DATA command execution time is two clocks; therefore, the amount of change is (Bd)=0.

The technological concept of the present invention has been described in detail while referring to a specific working example, but various changes and modifications can of course be made by persons skilled in the art as long as they do not deviate from the scope of the claims. For instance, optimizing program 82 can be stored on a computer-readable recording medium, including a floppy disk, CD-ROM, or hard disk, the program can be executed with a computer that is separate from the signal generator to optimize a pattern generation program, and the optimized pattern generator can be stored in the signal generator to obtain signal patterns. This is one embodiment of the present invention and does not exceed the technical scope of the present invention.

What is claimed is:

1. A method for optimizing a pattern generation program used in a signal generator comprising a generator for generating a signal pattern based on a pattern generation program, a memory for storing the signal pattern, and an output for outputting, on a predetermined cycle, the signal pattern stored by the memory, wherein said optimizing method comprises:
   evaluating, for each command of the pattern generation program, whether it is necessary to develop the command in question of the program; and
   developing the command.

2. The optimization method according to claim 1, wherein said evaluating whether it is necessary to develop the command comprises:
   evaluating whether or not the command is a subroutine call command, and
   in case the command is a subroutine call command, finding the amount of change in the stored number of signal patterns in the memory when the subroutine is being executed and a step for determining to develop the subroutine in case the amount of change is a predetermined value or smaller.

3. The optimizing method according to claim 1, wherein said evaluating whether it is necessary to develop the command comprises:
   evaluating whether the command is a loop command;
   in case the command is a loop command, finding the amount of change in the stored number of signal patterns in the memory before and after loop execution;
   finding the minimum value of the stored number of signal patterns in the memory during execution of the loop details; and
   determining to develop the loop command in case the amount of change and the minimum value are predetermined values or smaller.

4. The optimizing method according to claim 1, wherein said developing the command comprises:
   finding the maximum number of times a completed loop command is executed where there is no default; and
   adding the loop details before and after the loop command based on the maximum number of times of execution.

5. The optimizing method according to claim 1, further comprising:
   evaluating whether or not a command can be optimized; and
   in case the command cannot be optimized, executing a step for error processing.

6. A computer executable program that executes a method for optimizing a pattern generation program used in a signal generator comprising a generator for generating a signal pattern based on a pattern generation program, a memory for storing the signal pattern, and an output for outputting, on a predetermined cycle, the signal pattern stored by the memory, wherein said optimizing method comprises:
   evaluating, for each command of the pattern generation program, whether it is necessary to develop the command in question of the program; and
   developing the command.

7. A computer-readable recording medium for storing a computer executable program that executes a method for optimizing a pattern generation program used in a signal generator comprising a generator for generating a signal pattern based on a pattern generation program, a memory for storing the signal pattern, and an output for outputting, on a predetermined cycle, the signal pattern stored by the memory, wherein said optimizing method comprises:

evaluating, for each command of the pattern generation program, whether it is necessary to develop the command in question of the program; and developing the command.

8. A signal generator comprising:

a generator for generating a signal pattern based on a pattern generation program;

a first memory for storing the signal pattern;

a second memory for storing a program for executing an optimizing method comprising an evaluation step for evaluating each command of the pattern generation program, whether it is necessary to develop the command in question of the program as well as a development step for developing the command; and an output for outputting, on a predetermined cycle, the signal pattern stored by the first memory.

* * * * *